United States Patent
Kim

(12)
(10) Patent No.: US 6,331,802 B1
(45) Date of Patent: Dec. 18, 2001

(54) LINEAR GAIN CONTROL AMPLIFIER

(75) Inventor: Seong-Ryeol Kim, Choongcheongbuk-Do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/496,216

(22) Filed: Feb. 1, 2000

(30) Foreign Application Priority Data

Mar. 26, 1999 (KR) .................................. 99-10528

(51) Int. Cl.[7] .............................. H03G 3/20; H03F 3/191
(52) U.S. Cl. ............................................ 330/133; 330/303
(58) Field of Search .................................. 330/129, 133, 330/134, 303, 306

(56) References Cited

U.S. PATENT DOCUMENTS 5,099,204  3/1992  Wheatley, III .................... 330/279
6,101,373 * 8/2000  Samuels ........................ 330/133 X

* cited by examiner

Primary Examiner—Steven J. Mottola
(74) Attorney, Agent, or Firm—Morgan, Lewis & Bockius LLP

(57) ABSTRACT

A linear gain control amplifier includes a compensation circuit receiving an external loop control output, outputs a compensation signal approximated to an exponential function thereof, and is implemented in a standard CMOS process. A first amplifier amplifies an input signal in accordance with the compensation signal, a frequency compensation circuit compensates the phase shift of the first amplifier, a second amplifier amplifies an output of the frequency compensation circuit in accordance with the compensation signal, and a tank circuit is connected with the output terminal of the second amplifier to obtain a gain linearity as is required for a mobile communication terminal and a wide variable gain control range.

21 Claims, 3 Drawing Sheets

LINEAR GAIN CONTROL AMPLIFIER

BACKGROUND OF THE INVENTION

1. Field of the Invention

The present invention relates to a high frequency amplifier, and in particular to a linear gain control amplifier capable of implementing a gain linearity and a wide variable gain range.

2. Description of the Background Art

In a communication system, an input RF (radio frequency) signal is amplified by two amplifiers and is outputted as an output RF signal. In this case, the input RF signal is a signal having a wide gain range in the view of a receiver. In addition, in view of a transmitter, the input RF signal is a signal containing information to be transmitted. In view of the receiver, the output RF signal is a signal containing information used for the next circuit block. In view of the transmitter, the output RF signal is a signal having a wide gain range and is a signal to be amplified for transmitting the input RF signal over a certain distance.

Therefore, in the field of mobile communication systems, there is a need for a variable gain amplifier that includes a wide gain range for constantly receiving signals of various strength and for transmitting signals with signal strength based on a corresponding distance. Here, the variable amplifier should be provided with a characteristic that the gain is linearly varied based on a control voltage.

Generally, a variable gain amplifier is formed of a MOSFET, and the gain of the variable gain amplifier has a non-linear characteristic with respect to the control voltage. The reason why the gain has a non-linear characteristic is that the control voltage linearly controls the output voltage corresponding to the input voltage. The gain is a log value of the output signal, and thus the gain has a log characteristic with respect to the control voltage.

FIG. 1 illustrates the elements of a conventional linear gain control amplifier. The conventional linear gain control amplifier includes first and second amplifiers 12 and 16 which are formed in a two-stage structure to obtain a wide variable gain range. The first and second amplifiers 12 and 16 are each a variable gain amplifier formed of a dual gate MOSFET and their gain has a non-linear characteristic with respect to a control voltage. The conventional linear gain control amplifier also includes a compensation circuit 10 so that the control voltages of the first and second amplifiers 12 and 16 has an exponential function characteristic.

The compensation circuit 10 compensates a gain control signal AGCin outputted from an external loop control output (not shown) and outputs a compensation voltage for compensating the non-linearity of the first and second amplifiers 12 and 16. Here, the compensation signal has an exponential function characteristic. If the compensation signal has an exponential function characteristic, the gain characteristics of the first and second amplifiers 12 and 16 has a linearity.

FIG. 2 is a circuit diagram illustrating the compensation circuit 10. The inverting input terminal of an operational amplifier OP receives the gain control signal AGCin through a resistor R1 and is connected with an output terminal of the operational amplifier OP via a resistor R2 connected in parallel with a variable resistor R3 and in series with a diode D1. In addition, the non-inverting input terminal of the operational amplifier OP is connected with a supply voltage (-VCC) terminal via a resistor R4 and is connected with the ground voltage VSS via a reverse biased diode. Here, the resistors R1, R2 and R4 have the same resistance value of e.g. 10 KΩ, and the variable resistor R3 has a resistance value of e.g. 50 KΩ. In addition, the diodes D1 and D2 are of the same type for implementing a feed back operation with respect to the temperature variation. The diode D2 may be substituted by a device such as a thermistor.

The filter 14 is formed of a Surface Acoustic Wave (SAW) filter having a band pass filtering function, and filters an undesired frequency component from an output of the first amplifier 12.

The operation of the conventional linear gain control amplifier will be explained with reference to the accompanying drawings. When a gain control signal AGCin is inputted from an external loop control output (not shown), the compensation circuit 10 compensates the gain control signal AGCin and outputs a compensation signal having an exponential function characteristic to the first and second amplifiers 12 and 16, respectively.

In the compensation circuit, as shown in FIG. 2, if the gain control signal AGCin is larger than a reference voltage Vref at the non-inverting terminal of the operational amplifier OP (AGCin>Vref), a first slope of the compensation signal nearly becomes (R3∥R2)/R1. If the gain control signal AGCin is smaller than the reference voltage Vref (AGCin<Vref), a second slope of the compensation signal nearly becomes R3∥R1. Here, the second slope of the compensation signal is greater than the first slope. As a result, the compensation signal having the first and second slopes is outputted by the operational amplifier OP, which operates as an adder, thereby exponentially approximating the compensation signal to the exponential function.

Therefore, the first and second amplifiers 12 and 16 amplify the input signal RFin at the gain level determined by the compensation signal and the linear gain amplifier outputs an output signal Rfout. Thus, the gains of the first and second amplifiers 12 and 16 have a linearity based on the compensation signal having the exponential function characteristic. The filter 14, namely, the SAW filter having a band pass characteristic, filters the output of the first amplifier 12 and removes an undesired frequency component. However, since the insertion of the SAW filter causes an insertion loss (by about 20dB), the output of the first amplifier 12 and the input of the filter 14 are impedance-matched to minimize the insertion loss.

As described above, the conventional linear gain control amplifier uses the first and second amplifiers 12 and 16 to obtain a wide variable gain range. The conventional linear gain control amplifier also uses the compensation circuit 10 to compensate the gain control signal AGCin exponentially. Thus, the gain characteristic of the first and second amplifiers 12 and 16 has a linearity with respect to the control voltage.

However, the conventional linear gain control amplifier has the following disadvantages. First, since the conventional compensation circuit uses two power supply voltages +VCC and -VCC, the construction of the system becomes complicated.

Second, a diode may be implemented in a bipolar fabrication process, but a diode may not be easily implemented in a standard CMOS fabrication process. An additional process must be used to implement the diode in the standard CMOS process. Thus, since the compensation circuit has the diodes, the compensation circuit may not be easily implemented by the standard CMOS process.

Third, the SAW filter may not be integrated into an integrated circuit IC, and the compensation circuit also may not be implemented as one integrated circuit IC.

SUMMARY OF THE INVENTION

Accordingly, the present invention is directed to a linear gain control amplifier that substantially obviates one or more of the problems due to limitations and disadvantages of the background art.

An object of the present invention is a linear gain control amplifier that can obtain a gain linearity and a wide variable gain range which is required for a mobile communication terminal.

Another object of the present invention is a linear gain control amplifier that is easily implemented in a standard CMOS process and an integrated circuit IC.

A further object of the present invention is a linear gain control amplifier that has a simple construction and requires a single power supply voltage.

Additional features and advantages of the invention will be set forth in the description which follows, and in part will be apparent from the description, or may be learned by practice of the invention. The objectives and other advantage of the invention will be realized and attained by the structure particularly pointed out in the written description and claims hereon as well as the appended drawings.

To achieve these and other advantages and in accordance with the purpose of the invention, as embodied and broadly described, a linear gain control amplifier for providing an amplified output signal comprises a compensation circuit for receiving an AGC signal and outputting a compensation signal approximating an exponential function of the AGC signal, a first amplifier for amplifying an input signal in accordance with the compensation signal to provide a first output signal, a frequency compensation circuit receiving the first output signal and providing a second output signal compensated for a phase shift in the output signal of the first amplifier, and a second amplifier for amplifying the second output signal in accordance with the compensation signal from the compensation circuit to provide a third output signal.

The present invention also contemplates a compensation circuit for use in a mobile communication system including a compensation circuit for compensating an AGC signal from an automatic gain control circuit and outputting a gain control signal, and first and second amplifiers for amplifying a radio frequency signal in accordance with the gain control signal from the compensation circuit, the compensation circuit comprising a voltage generator for receiving the AGC signal and generating a first voltage in connection therewith, a source of a power supply voltage, a voltage divider unit for dividing the power supply voltage, and an operational amplifier having an inverting input terminal for receiving the first voltage, a non-inverting input terminal for receiving a second voltage, and an output terminal for outputting a compensation signal having first and second slopes.

It is to be understood that both the foregoing description and the following detailed description are exemplary and explanatory and are intended to provide further explanation of the invention as claimed.

BRIEF DESCRIPTION OF THE DRAWINGS

The present invention will become more fully understood from the detailed description given hereinbelow and the accompanying drawings which constitute a part of this description and are given by way of illustration only and thus are not limitative of the present invention, and wherein.

DETAILED DESCRIPTION OF THE PREFERRED EMBODIMENTS

Figure 1:
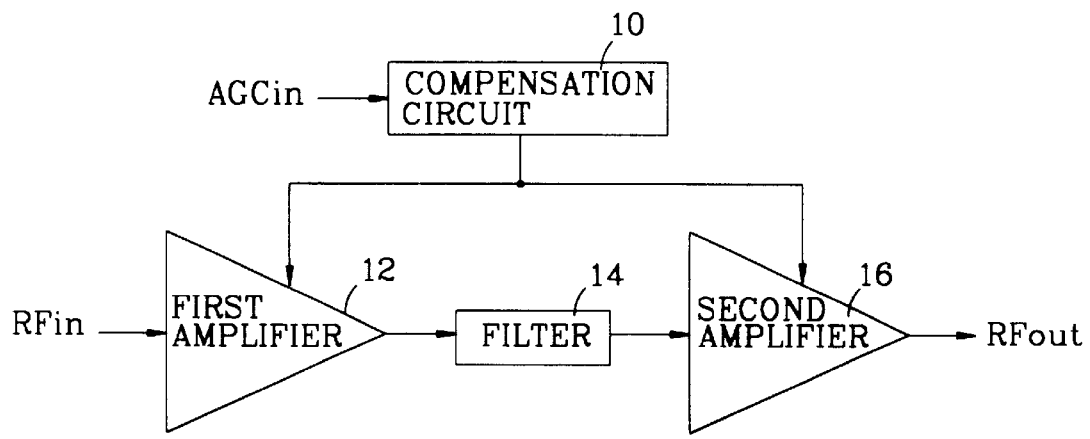
FIG. 1 is a schematic block diagram illustrating a conventional linear gain control amplifier.
Figure 2:
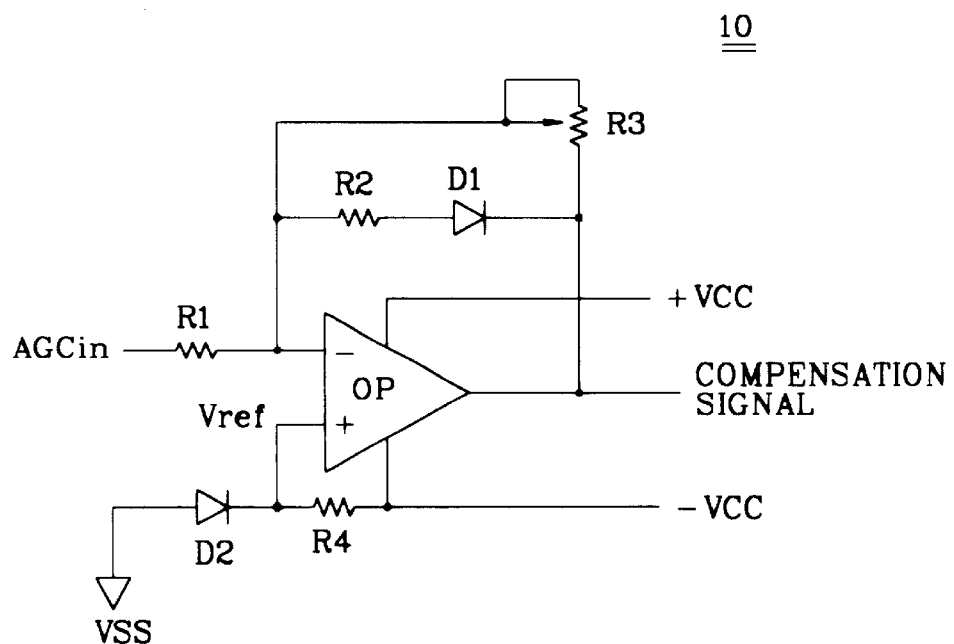
FIG. 2 is a detailed schematic circuit diagram illustrating a compensation circuit of the amplifier of FIG. 1.
Figure 3:
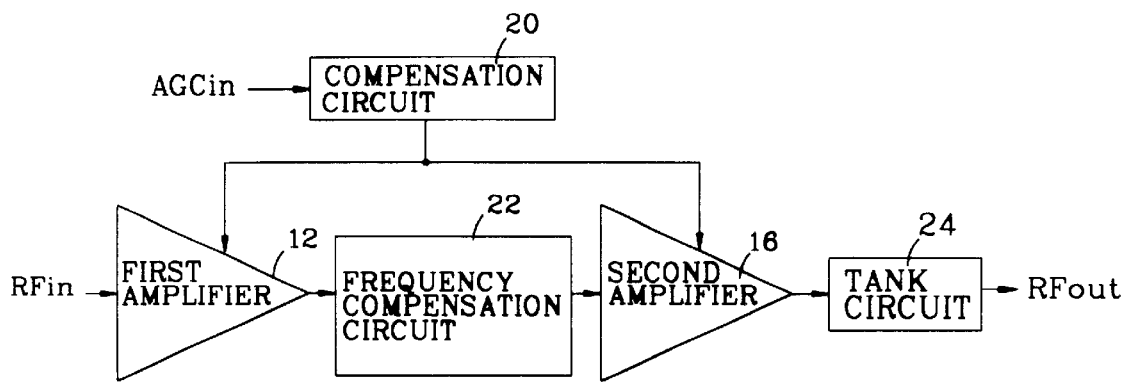
FIG. 3 is a schematic block diagram illustrating a linear gain control amplifier according to the present invention.

As shown in FIG. 3, the linear gain control amplifier according to the present invention includes first and second amplifiers 12 and 16, a compensation circuit 20, a frequency compensation circuit 22, and a tank circuit 24.

The first and second amplifiers 12 and 16 are the same as in the known art. The compensation circuit 20 used for controlling the gains of the first and second amplifiers 12 and 16 is implemented based on the standard CMOS process. The frequency compensation circuit 22 is connected between the first and second amplifiers 12 and 16 to compensate for a phase shift of the first amplifier 12 and to operate as a high pass filter (HPF). In addition, a tank circuit 24, which is a parallel synchronization circuit with an inductance L and a capacitance C, is connected with the output terminal of the second amplifier 16.

Figure 4:
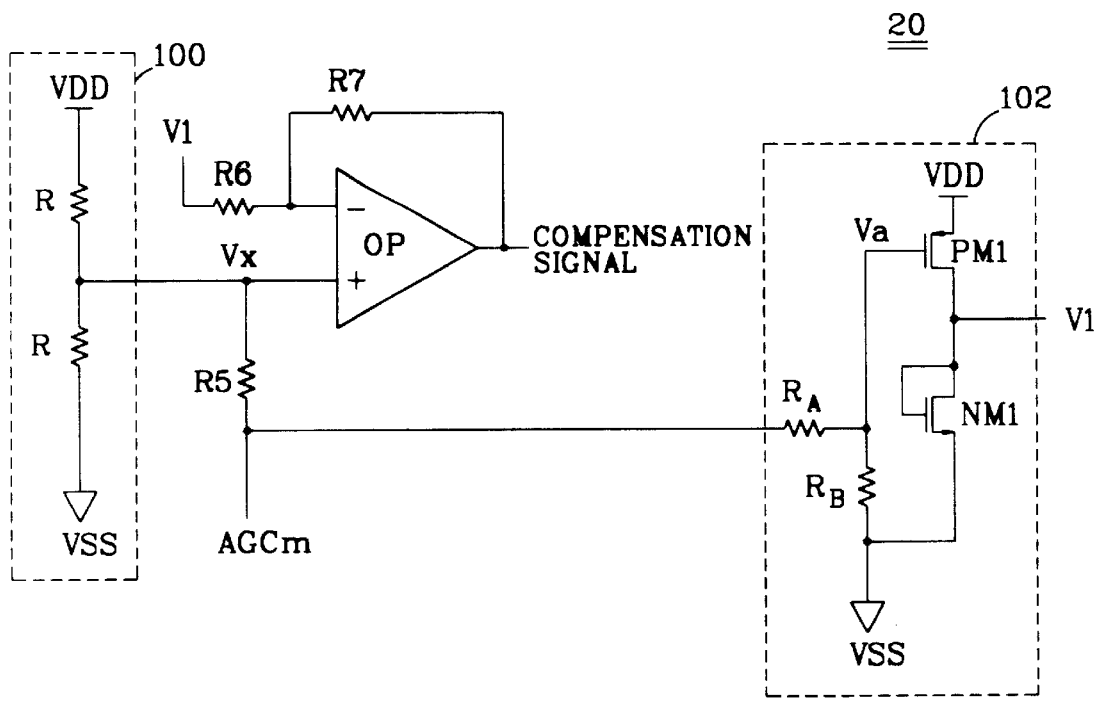
FIG. 4 is a detailed schematic circuit diagram illustrating a compensation circuit in the amplifier of FIG. 3.

FIG. 4 illustrates the construction of the compensation circuit 20. The compensation circuit 20 uses one power supply voltage VDD and a ground voltage VSS and includes resistors, an operational amplifier OP, and a MOS transistor so that the first and second compensation voltages V1 and Vx are made to have different slopes with respect to the applied gain control signal AGCin.

The inverting input terminal of the operational amplifier OP is connected with the output terminal of the operational amplifier OP via a resistor R7, which receives the first voltage V1 from a voltage generator 102 via a resistor R6. The non-inverting input terminal of the operational amplifier OP is connected with a voltage divider 100 and receives the gain control signal AGCin via a resistor R5.

The voltage divider 100 includes two series resistors R which divide the power supply voltage by half. The common connection node of the two resistors R is connected with the non-inverting input terminal of the operational amplifier OP. The voltage generator 102 includes a voltage divider formed by series resistors $R_A$ and $R_B$, which divides the gain control signal AGCin relative to ground potential to output a divided voltage Va. A PMOS transistor PM1 and a NMOS transistor NM1 have their channels connected in series between the power supply voltage VDD and ground. The gate of the PMOS transistor PM1 receives the divided voltage Va, and the gate of the NMOS transistor NM1 is connected with its drain and forms a common drain.

Figure 5:
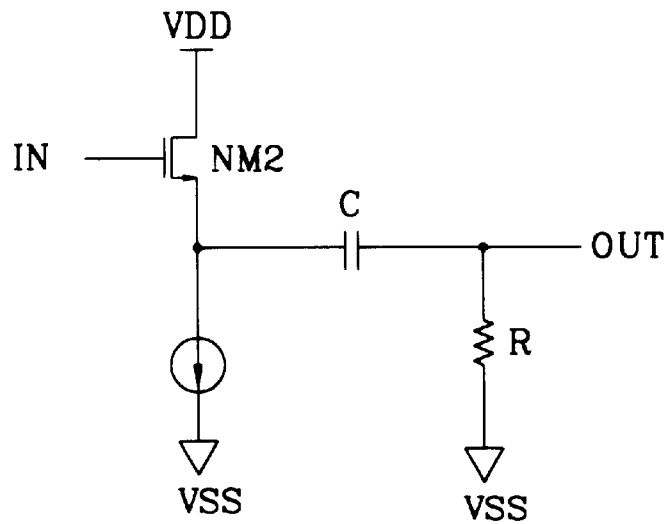
FIG. 5 is a detailed schematic circuit diagram illustrating a frequency compensation circuit in the amplifier of FIG. 3.

As shown in FIG. 5, the frequency compensation circuit 22 is a high pass filter, which is formed with an NMOS transistor NM2.

The operation of the linear gain control amplifier constructed according to the present invention will be explained with reference to the accompanying drawings.

The compensation circuit 20 compensates the gain control signal AGCin inputted from the external loop control output (not shown) and outputs a compensation signal having an exponential function characteristic. If the compensation signal has an exponential function characteristic, the gain characteristics of the first and second amplifiers 12 and 16 have a linearity. At this time, the characteristic of the log function is largely changed with respect to a smaller input value. In addition, there is not a large change with respect to a higher input value. Therefore, the compensation circuit 20 is constituted so that in the case that the gains of the first and second amplifiers 12 and 16 are small, the slope of the compensation signal is small, and in the case that the gains of the first and second amplifiers 12 and 16 are high, the slope of the compensation signal is high.

In the compensation circuit 20, as shown in FIG. 4, when the gain control signal AGCin is inputted, the voltage divider 100 divides the power supply voltage VDD and outputs ½ VDD, and the voltage generator 102 controls the PMOS transistor PM1 using the voltage Va divided by the resistors $R_A$ and $R_B$. At this time, the output voltages of the voltage divider 100 and the voltage generator 102 may be of various types. For example, in the voltage divider 100, two resistors may be differently constituted for thereby varying the divided output voltage. The voltage generator 102 changes the channel size ratio between the divided voltage Va and the PMOS transistor PM1 and the NMOS transistor NM1 to vary the first voltage V1.

The compensation circuit 20 operates as an adder, which adds the first and second voltages V1 and Vx.

The first and second voltages V1 and Vx may be expressed as function of the gain control signal AGCin.

$$Vx = R5 \frac{VDD}{R+2R5} + \frac{R}{R+2R5} \times AGCin \quad (1)$$

$$V1 = Vtn + \sqrt{\frac{(W/L)_{PM1}}{2(W/L)_{NM1}}} \times (VDD - Vtp - Va) \quad (2)$$

where Va represents $$AGCin \times \frac{R_B}{R_A + R_B},$$

and Vtn and Vtp respectively represent the threshold voltages of the NMOS transistor NM1 and the PMOS transistor, and $(W/L)_{pm1}$ and $(W/L)_{NM1}$ respectively represent the channel sizes of the PMOS transistor PM1 and the NMOS transistor NM1.

The PMOS transistor PM1 operates in the linear region, the saturation region, or the cut-off region based on the divided voltage Va applied to its gate. In the linear region, since there is no practical voltage drop through the PMOS transistor PM1, the first voltage V1 becomes the power supply voltage VDD, and in the cut off region, it is possible to avoid the cut off region by properly controlling the ratio of the resistors $R_A$ and $R_B$.

Figure 6:
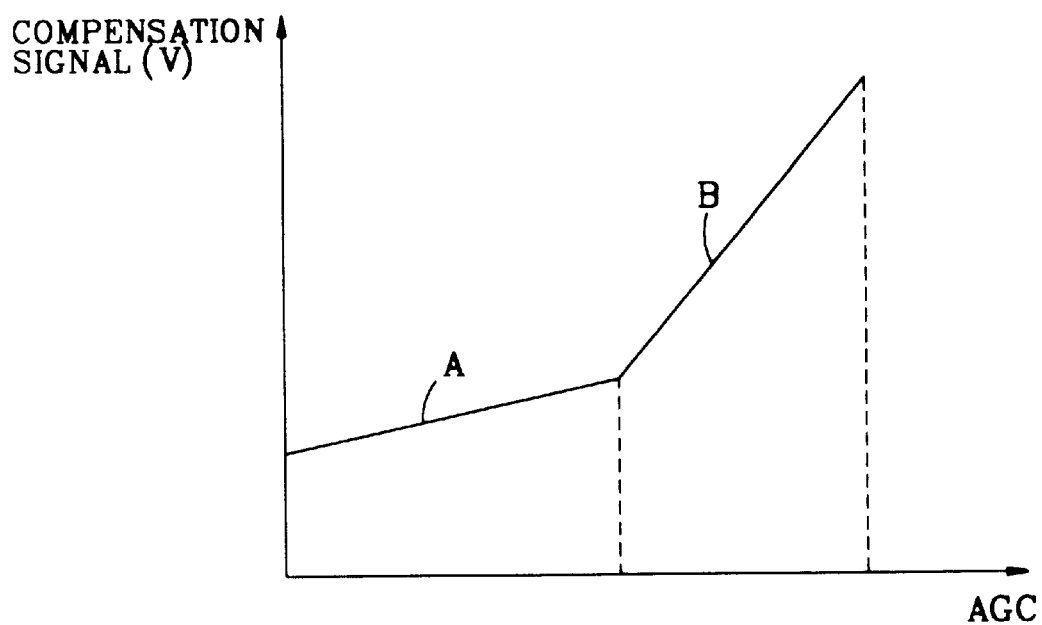
FIG. 6 is a graph illustrating the slope of a compensation signal with respect to an AGC signal of FIG. 3.

If the first voltage V1 is smaller than the second voltage Vx applied at the non-inverting input terminal of the operational amplifier OP(V1<Vx), the first slope of the compensation signal becomes the slope as indicated at A in FIG. 6. If the first voltage V1 is greater than the second voltage Vx applied at the non-inverting input terminal of the operational amplifier OP(V1>Vx), the second slope of the compensation voltage becomes the slope as indicated at B in FIG. 6. In the saturation region of the PMOS transistor, the second slope is varied by the channel size ratio between the divided voltage Va, the PMOS transistor PM1 and the NMOS transistor NM1.

Therefore, it is possible to output a compensation signal approximated to an exponential function as shown in FIG. 6 by properly adding the first and second voltages V1 and Vx which are varied based on the AGC signal. As shown in FIG. 5, the frequency compensation circuit 22 isolates the first and second amplifiers 12 and 16. The capacitor C eliminates a DC component and the resister R passes an AC component to ground. Thus, the frequency compensation circuit 22 blocks the phase shift generated in case that the first and second amplifiers 12 and 16 are directly connected, thereby compensating the same. In addition, the frequency compensation circuit 22 operates as a high pass filter (gain=1) for eliminating a frequency component and noise component from the low frequency band.

In the present invention, the output terminal of the second amplifier 16 is formed as an open drain, and the tank circuit 24, which is an LC-parallel synchronization circuit, is connected with the open drain to enhance the output efficiency of the second amplifier 16.

As described above, the linear control amplifier according to the present invention is capable of obtaining linearity of the gain with respect to a wide variable gain range and a control voltage which are required for the mobile communication terminal. In addition, the linear gain control amplifier according to the present invention is capable of significantly overcoming the problems encountered in the known art. In more detail, a frequency compensation circuit is implemented which is capable of compensating a phase shift and performing the high pass operation of a known SAW filter. Accordingly, an IC circuit is able to be implemented. The present invention is easily implemented even in the standard CMOS process without using the diodes. The system is simply constituted using a single power supply voltage.

Although a preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:

1. A linear gain control amplifier for providing an amplified output signal, comprising:
    a compensation circuit for receiving an AGC signal and outputting a compensation signal approximating an exponential function of the AGC signal;
    a first amplifier for amplifying an input signal in accordance with the compensation signal to provide a first output signal;
    a frequency compensation circuit receiving the first output signal and providing a second output signal compensated for a phase shift in the output signal of the first amplifier, the frequency compensation circuit including a high pass filter; and
    a second amplifier for amplifying the second output signal in accordance with the compensation signal from the compensation circuit to provide a third output signal.

2. A linear gain control amplifier according to claim 1, further comprising a tank circuit receiving the third output signal and providing the amplified output signal.

3. A linear gain control amplifier according to claim 1, wherein the high pass filter is formed with a MOSFET.

4. A linear gain control amplifier according to claim 1, wherein said compensation circuit includes:
    a voltage divider for dividing a power supply voltage;
    a voltage generator for receiving the AGC signal and generating a first voltage in accordance therewith; and an operational amplifier having an inverting input terminal for receiving the first voltage and a non-inverting input terminal for receiving a second voltage corresponding to the divided power supply voltage, the operational amplifier outputting a compensation signal having first and second slopes.

5. A linear gain control amplifier according to claim 4, wherein the first slope is formed based on the second voltage, and the second slope is formed based on the first voltage, and the second slope is greater than the first slope.

6. A linear gain control amplifier according to claim 4, further including:
   a first resistor for coupling the inverting input terminal to the first voltage;
   a second resistor for coupling the output of the operational amplifier to the inverting input terminal; and
   a third resistor for coupling the non-inverting input terminal to the AGC signal.

7. A linear gain control amplifier according to claim 4, wherein the compensation circuit includes a MOSFET and wherein the second slope is varied in a saturation region of the MOSFET of the compensation circuit.

8. A linear gain control amplifier according to claim 7, further including two series resistors for dividing the-AGC signal to provide a gate voltage control signal, and wherein the gate voltage control signal is applied to the MOSFET in the compensation circuit to vary the second slope.

9. A linear gain control amplifier according to claim 8, wherein the MOSFET in the compensation circuit is a P-type, and wherein the second slope is varied in accordance with a gate voltage of the PMOSFET.

10. A linear gain control amplifier according to claim 8, wherein the MOSFET in the compensation circuit is a P-type and the two series resistors have different resistance values.

11. A linear gain control amplifier according to claim 4, wherein the voltage generator includes:
    first and second voltage dividing resistors connected in series to divide the AGC signal;
    a source of a power supply voltage;
    PMOS transistor having a source connected to the power supply voltage source, a drain, and a gate receiving the divided voltage from the first and second voltage dividing resistors; and
    an NMOS transistor connected between the PMOS transistor and ground and having a commonly connected gate and drain connected to the drain of the PMOS transistor and forming an output terminal of the first voltage.

12. A linear gain control amplifier according to claim 11, wherein the first and second voltage dividing resistors have different resistance values, and the PMOS transistor operates in a saturation region based on the divided voltage, the slope of the first voltage being determined by the ratio of the values of the first and second voltage dividing resistors.

13. A compensation circuit for use in a mobile communication system including a compensation circuit for compensating an AGC signal from an automatic gain control circuit and outputting a gain control signal, and first and second amplifiers for amplifying a radio frequency signal in accordance with the gain control signal from the compensation circuit, the compensation circuit comprising:
    a voltage generator for receiving the AGC signal and generating a first voltage in connection therewith;
    a source of a power supply voltage;
    a voltage divider unit for dividing the power supply voltage;
    an operational amplifier having an inverting input terminal for receiving the first voltage, a non-inverting input terminal for receiving a second voltage corresponding to the divided power supply voltage, and an output terminal for outputting a compensation signal having first and second slopes; and
    a frequency compensation circuit including a high pass filter and connected to an output of the first amplifier.

14. A compensation circuit according to claim 13, further including a first resistor for coupling the first voltage to the inverting input terminal, a second resistor for coupling the output terminal of the operational amplifier to the inverting terminal thereof, and a third resistor for coupling the AGC signal to the non-inverting input terminal, the non-inverting input terminal further being coupled to the output of the voltage divider unit.

15. A compensation circuit according to claim 13, wherein the frequency compensation circuit filters the output of the first amplifier and compensates for a phase shift of the first amplifier to output a compensated signal to the second amplifier.

16. A compensation circuit according to claim 13, further comprising a tank circuit connected to an output of the second amplifier.

17. A compensation circuit according to claim 13, wherein the voltage generator comprises:
    fourth and fifth resistors coupled to the AGC signal and connected in series to provide a voltage divided AGC signal at a common connection node;
    a first MOS transistor having a source connected with the power supply voltage, a drain, a channel, and a gate coupled to the common connection node; and
    a second MOS transistor having a channel connected between the channel of the first MOS transistor and ground, and a gate and a drain commonly connected, the drain of the first MOS transistor and the drain of the second MOS transistor being coupled in common to form a first voltage output terminal.

18. A compensation circuit according to claim 13, wherein the compensation circuit includes a single power supply voltage, and the voltage divider unit is formed of two resistors.

19. A compensation circuit according to claim 17, wherein the first MOS transistor is a PMOS transistor, the second MOS transistor is an NMOS transistor, and the first and second resistors have different resistance values.

20. A compensation circuit according to claim 13, wherein the first slope is based on the second voltage, the second slope is based on the first voltage, and the second slope is greater than the first slope.

21. A compensation circuit of claim 17, wherein the first voltage is generated in a saturation region of the first MOS transistor based on a variation of a gate voltage at the common connection node, and the slope of the first voltage is determined by the divided voltage applied to the gate of the first MOS transistor and the channel size ratio of the first and second MOS transistors.

* * * * *